(12) United States Patent
Hattori et al.

(10) Patent No.: US 8,911,869 B2
(45) Date of Patent: Dec. 16, 2014

(54) TRANSPARENT SUBSTRATE

(75) Inventors: Daisuke Hattori, Ibaraki (JP); Toshiyuki Iida, Ibaraki (JP); Takeshi Murashige, Ibaraki (JP); Takashi Yamaoka, Ibaraki (JP); Tatsuki Nagatsuka, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 381 days.

(21) Appl. No.: 13/501,044

(22) PCT Filed: Oct. 20, 2010

(86) PCT No.: PCT/JP2010/068473
§ 371 (c)(1),
(2), (4) Date: Apr. 9, 2012

(87) PCT Pub. No.: WO2011/049124
PCT Pub. Date: Apr. 28, 2011

(65) Prior Publication Data
US 2012/0202074 A1    Aug. 9, 2012

(30) Foreign Application Priority Data
Oct. 22, 2009    (JP) .................................. 2009-243135

(51) Int. Cl.
*C03C 17/34* (2006.01)
*H01L 31/0216* (2014.01)
(Continued)

(52) U.S. Cl.
CPC .............. *C08G 63/193* (2013.01); *H02S 30/00* (2013.01); *H01L 31/0216* (2013.01); *C03C 17/324* (2013.01); *C03C 17/32* (2013.01); *C03C 17/34* (2013.01); *C03C 17/326* (2013.01); *C03C 17/3405* (2013.01); *C09D 167/02* (2013.01); *B32B 17/064* (2013.01); *C03C 2218/365* (2013.01)
USPC .......................... 428/411.1; 428/412; 428/426

(58) Field of Classification Search
None
See application file for complete search history.

(56) References Cited

U.S. PATENT DOCUMENTS

| 4,387,209 A | 6/1983 | Rieder et al. |
| 4,388,454 A | 6/1983 | Rieder et al. |

(Continued)

FOREIGN PATENT DOCUMENTS

| CN | 1367766 A | 9/2002 |
| CN | 101356558 A | 1/2009 |

(Continued)

OTHER PUBLICATIONS

Japanese Office Action dated Aug. 7, 2013, issued in corresponding Japanese Application No. 2010-235198 w/ English Translation. (12 pages).

(Continued)

*Primary Examiner* — Ramsey Zacharia
(74) *Attorney, Agent, or Firm* — Westerman, Hattori, Daniels & Adrain, LLP

(57) ABSTRACT

The present invention provides a transparent substrate excellent in solvent crack resistance, toughness, heat resistance, and flexibility. A transparent substrate according to an embodiment of the present invention includes: an inorganic glass; and a first resin layer placed on at least one side of the inorganic glass, wherein: the first resin layer contains a resin compound having a weight-average molecular weight in terms of polystyrene of $8\times10^4$ to $100\times10^4$; and no solvent crack occurs when a mixed solvent containing 20 wt % to 95 wt % of at least one kind of solvent selected from the group consisting of acetone, N-methylpyrrolidone, dimethyl sulfoxide, and N,N-dimethylformamide is brought into contact with the substrate.

11 Claims, 1 Drawing Sheet

(51) Int. Cl.
  *H02S 30/00* (2014.01)
  *C08G 63/193* (2006.01)
  *H01L 31/042* (2014.01)
  *C03C 17/32* (2006.01)
  *C09D 167/02* (2006.01)
  *B32B 17/06* (2006.01)

(56) References Cited

U.S. PATENT DOCUMENTS

| | | |
|---|---|---|
| 4,418,122 A | 11/1983 | Rieder et al. |
| 4,430,493 A | 2/1984 | Rieder |
| 4,446,195 A | 5/1984 | Rieder et al. |
| 5,569,537 A | 10/1996 | Miyasaka et al. |
| 5,686,553 A | 11/1997 | Tai et al. |
| 6,281,525 B1 | 8/2001 | Krijn et al. |
| 6,592,969 B1 | 7/2003 | Burroughes et al. |
| 6,689,626 B2 | 2/2004 | Krijn et al. |
| 6,815,070 B1 | 11/2004 | Burkle et al. |
| 6,853,123 B1 | 2/2005 | Nattermann et al. |
| 6,994,906 B2 | 2/2006 | Burroughes et al. |
| 7,359,021 B2 | 4/2008 | Ota et al. |
| 7,514,866 B2 | 4/2009 | Burroughes et al. |
| 7,806,744 B2 | 10/2010 | Ota et al. |
| 7,812,530 B2 | 10/2010 | Handa et al. |
| 7,999,059 B2 | 8/2011 | Hirayama et al. |
| 8,241,735 B2 | 8/2012 | Murashige et al. |
| 2001/0050372 A1 | 12/2001 | Krijn et al. |
| 2003/0124341 A1 | 7/2003 | Burroughes et al. |
| 2004/0141141 A1 | 7/2004 | Ota et al. |
| 2005/0236985 A1 | 10/2005 | Handa et al. |
| 2006/0134394 A1 | 6/2006 | Burroughes et al. |
| 2008/0160871 A1 | 7/2008 | Ota et al. |
| 2010/0062234 A1 | 3/2010 | Murashige et al. |
| 2010/0143681 A1 | 6/2010 | Yano et al. |
| 2010/0276066 A1 | 11/2010 | Kondo |
| 2011/0064930 A1 | 3/2011 | Hirayama et al. |

FOREIGN PATENT DOCUMENTS

| | | |
|---|---|---|
| JP | 4-235527 A | 8/1992 |
| JP | 5-2694 B2 | 1/1993 |
| JP | 6-340029 A | 12/1994 |
| JP | 7-205374 A | 8/1995 |
| JP | 9-208676 A | 8/1997 |
| JP | 11-329715 A | 11/1999 |
| JP | 2001-81285 A | 3/2001 |
| JP | 2001-113631 A | 4/2001 |
| JP | 2002-521234 A | 7/2002 |
| JP | 2002-297054 A | 10/2002 |
| JP | 2002-534305 A | 10/2002 |
| JP | 2002-542971 A | 12/2002 |
| JP | 2003-212600 A | 7/2003 |
| JP | 2003-337549 A | 11/2003 |
| JP | 2004-50565 A | 2/2004 |
| JP | 2004-79432 A | 3/2004 |
| JP | 2005-14563 | 1/2005 |
| JP | 2005-297498 A | 10/2005 |
| JP | 2005-353393 A | 12/2005 |
| JP | 2007-10834 A | 1/2007 |
| JP | 2007-70605 A | 3/2007 |
| JP | 2007-126580 A | 5/2007 |
| JP | 2007-203473 A | 8/2007 |
| JP | 2008-107510 A | 5/2008 |
| JP | 4092192 B2 | 5/2008 |
| JP | 2008-242154 A | 10/2008 |
| JP | 2009-128794 A | 6/2009 |
| JP | 2010-125719 A | 6/2010 |
| JP | 2010-221441 A | 10/2010 |
| JP | 2010-280092 A | 12/2010 |
| WO | 2009/069444 A1 | 6/2009 |
| WO | 2009/093505 A1 | 7/2009 |

OTHER PUBLICATIONS

International Search Report of PCT/JP2010/068473, mailing date of Feb. 8, 2011.
Chinese Office Action dated Jan. 6, 2014, in corresponding to Chinese Application No. 201080047446.X with English Translation. (16 pages).

TRANSPARENT SUBSTRATE

TECHNICAL FIELD

The present invention relates to a transparent substrate. More specifically, the present invention relates to a transparent substrate excellent in solvent crack resistance, toughness, heat resistance, and flexibility.

BACKGROUND ART

In recent years, the weight reductions and thinning of display apparatuses like flat panel displays (FPDs: liquid crystal display apparatuses, organic EL display apparatuses, and the like) have been progressing with the development of visual communication technologies. Glass substrates have been conventionally used as substrates for use in the display apparatuses in many cases. The glass substrates are each excellent in transparency, solvent resistance, gas barrier properties, and heat resistance. However, when one attempts to achieve the thinning of a glass material of which any such glass substrate is formed, the following problem arises. While the weight reduction is achieved and the glass substrate shows excellent flexibility, its impact resistance is insufficient, and hence the glass substrate becomes difficult to handle.

In order that the handleability of thin glass substrates may be improved, substrates in each of which a resin layer is formed on a glass surface have been disclosed (see, for example, Patent documents 1, 2, and 3). Such substrate is produced by attaching a resin film to the glass surface or coating the glass surface with a thermoplastic resin. The substrate thus produced can obtain such a certain effect as to have flexibility.

However, when such substrate is used in a display device or the like, the following problem arises. The substrate is poor in durability against various solvents (such as acetone) to be used upon production of the display device.

CITATION LIST

Patent Documents

[PTL 1] JP 11-329715 A
[PTL 2] JP 2008-107510 A
[PTL 3] JP 2002-542971 A

SUMMARY OF INVENTION

Problems to be Solved by the Invention

The present invention has been made to solve the problems, and an object of the present invention is to provide a transparent substrate excellent in solvent crack resistance, toughness, heat resistance, and flexibility.

Means for Solving the Problems

A transparent substrate according to an embodiment of the present invention includes: an inorganic glass; and a first resin layer placed on at least one side of the inorganic glass, wherein: the first resin layer contains a resin compound having a weight-average molecular weight in terms of polystyrene of $8 \times 10^4$ to $100 \times 10^4$; and no solvent crack occurs when a mixed solvent containing 20 wt % to 95 wt % of at least one kind of solvent selected from the group consisting of acetone, N-methylpyrrolidone, dimethyl sulfoxide, and N,N-dimethylformamide is brought into contact with the substrate.

In a preferred embodiment, the first resin layer contains a resin compound having repeating units represented by general formulae (1), (2), and (3):

[Chem. 1]

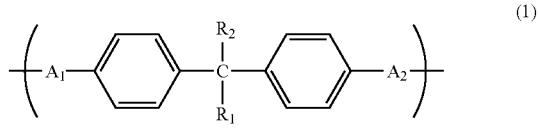

(1)

(2)

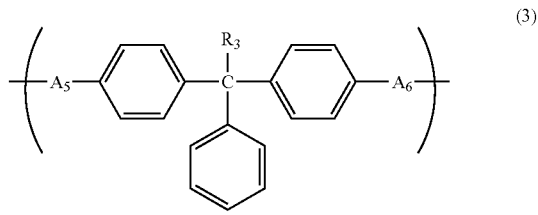

(3)

(4)

(5)

(6)

(7)

(8)

in the formula (1), $R_1$ represents a linear or branched alkyl group having 1 to 5 carbon atoms, $R_2$ represents a linear or branched alkyl group having 2 to 5 carbon atoms, and $A_1$ and $A_2$ each independently represent an oxygen atom, a single bond, or a linking group represented by a general formula (5); in the formula (2), X represents a substituted or unsubstituted arylene group having 6 to 18 carbon atoms, and $A_3$ and $A_4$ each independently represent at least one kind selected from linking groups represented by general formulae (4) to (8), and the $A_3$ and the $A_4$ are bonded to para positions or meta positions of X; in the formula (3), $R_3$ represents a methyl group, or a substituted or unsubstituted aryl group having 6 to 18 carbon atoms, and $A_5$ and $A_6$ each independently represent an oxygen atom, a single bond, or the linking group represented by the general formula (5); and the number of $A_3$'s and $A_4$'s bonded to the para positions is three or more times as large as the number of $A_3$'s and $A_4$'s bonded to the meta positions.

In a preferred embodiment, in the formula (1), $R_1$ represents a linear or branched alkyl group having 1 to 3 carbon atoms and $R_2$ represents a linear or branched alkyl group having 3 or 4 carbon atoms; in the formula (2), X represents a substituted or unsubstituted arylene group having 6 to 12 carbon atoms, and $A_3$ and $A_4$ each independently represent the linking group represented by the following general formula (4) or the general formula (5); and in the formula (3), $R_3$ represents a methyl group, or a substituted or unsubstituted aryl group having 6 to 12 carbon atoms.

In a preferred embodiment, in the formula (1), $R_1$ represents a methyl group and $R_2$ represents an isobutyl group; in the formula (2), X represents a substituted or unsubstituted arylene group having 6 to 12 carbon atoms, $A_3$ and $A_4$ each independently represent the linking group represented by the following general formula (4) or the general formula (5), and the $A_3$ and the $A_4$ are bonded to the para positions of X; and in the formula (3), $R_3$ represents a methyl group, or a substituted or unsubstituted aryl group having 6 to 12 carbon atoms.

In a preferred embodiment, the resin compound further has a repeating unit represented by a general formula (9):

[Chem. 2]

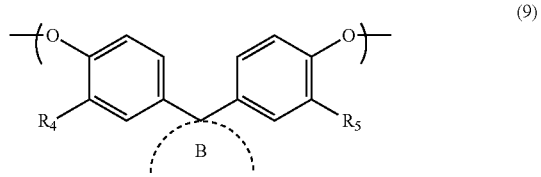

(9)

in the formula (9), $R_4$ and $R_5$ each independently represent a methyl group or hydrogen, and B represents a substituted or unsubstituted cycloalkane having 4 to 9 carbon atoms, or a substituted or unsubstituted fluorene.

In a preferred embodiment, the transparent substrate according to an embodiment of the present invention further includes a coupling agent layer provided directly for the inorganic glass.

In a preferred embodiment, the transparent substrate according to an embodiment of the present invention further includes a second resin layer between the inorganic glass and the first resin layer.

In a preferred embodiment, the transparent substrate according to an embodiment of the present invention has a rupture diameter, which is determined when the transparent substrate is cracked and bent, of 50 mm or less.

In a preferred embodiment, the resin compound is soluble in a solvent containing 50 wt % or more of toluene and/or xylene.

According to another aspect of the present invention, a display device is provided. The display device is produced using the above-described transparent substrate.

According to another aspect of the present invention, a solar cell is provided. The solar cell is produced using the above-described transparent substrate.

According to another aspect of the present invention, a lighting device is provided. The lighting device is produced using the above-described transparent substrate.

Advantageous Effects of Invention

The inventors of the present application have newly found that the conventional problem, i.e., the poor durability of the substrate against the various solvents is caused by a solvent crack occurring upon contact of the substrate with any one of the various solvents. Specifically, when the resin layer is formed on the glass surface as described above, a stress (such as a stress generated by the drying shrinkage of a resin solution) occurs in the resin layer, and a solvent crack occurs in the substrate upon contact of any one of the various solvents with the resin layer where the stress exists. According to the present invention, a transparent substrate excellent in solvent crack resistance can be provided by providing on at least one side of an inorganic glass with a resin layer containing a resin compound having a specific weight-average molecular weight. In addition, the incorporation of a resin compound having a specific structure into the resin layer can provide a transparent substrate significantly excellent in solvent crack resistance and excellent in toughness, heat resistance, and flexibility.

DESCRIPTION OF EMBODIMENTS

A. Entire Configuration of Transparent Substrate

Figure 1A:
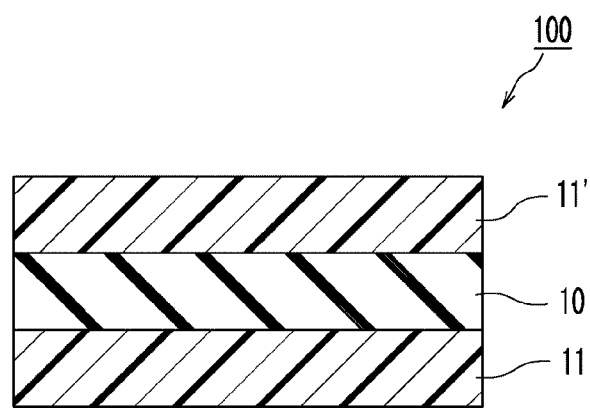
FIG. 1(a) is a schematic sectional view of a transparent substrate according to one embodiment of the present invention.

FIG. 1(a) is a schematic sectional view of a transparent substrate according to a preferred embodiment of the present invention. The transparent substrate 100 includes an inorganic glass 10 and a first resin layer 11, 11' placed on at least one side of the inorganic glass 10 (preferably on each of both sides like the illustrated example). Although not shown, any appropriate adhesive layer is placed between the inorganic glass 10 and the first resin layer 11, 11' as a matter of practicality.

Figure 1B:
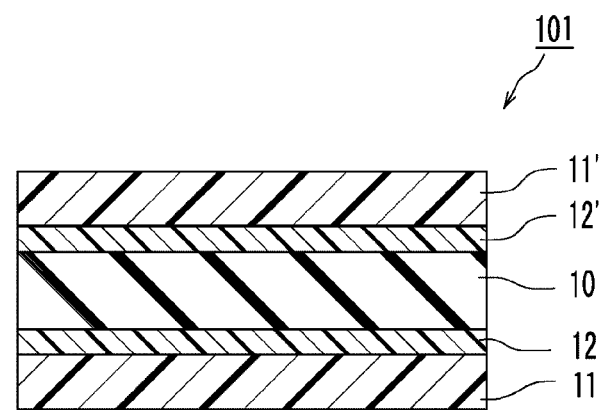
FIG. 1(b) is a schematic sectional view of a transparent substrate according to another embodiment of the present invention.

FIG. 1(b) is a schematic sectional view of a transparent substrate according to another embodiment of the present invention. In this embodiment, a transparent substrate 101 further includes a layer 12, 12' containing a coupling agent (hereinafter, sometimes referred to as "coupling agent layer") between the inorganic glass 10 and the first resin layer 11, 11'. Although not shown, any appropriate adhesive layer may be placed between the first resin layer 11, 11' and the coupling agent layer 12, 12'.

When the transparent substrate of the present invention includes the coupling agent layer 12, 12', the coupling agent layer 12, 12' is preferably provided directly for the inorganic glass 10 (that is, without through any adhesive or pressure-sensitive adhesive) as illustrated in FIG. 1(b). As long as the coupling agent layer 12, 12' is provided directly for the inorganic glass 10 as described above, the following transparent substrate is obtained. Even under a high-temperature, high-humidity environment, the substrate is excellent in adhesiveness between the inorganic glass and the resin layer, and a crack hardly progresses at the time of its cutting.

Figure 1C:
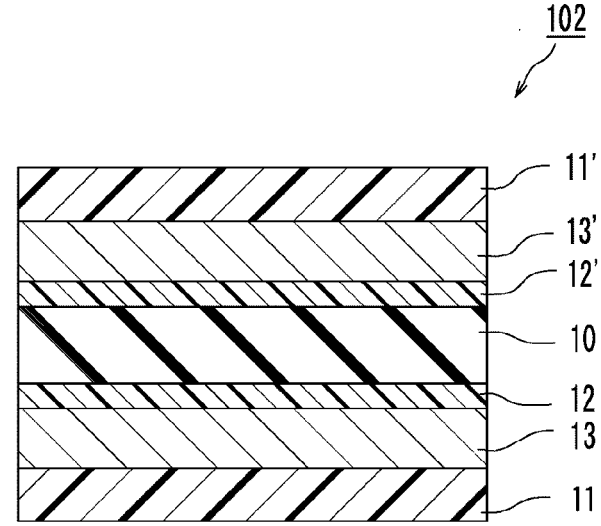
FIG. 1(c) is a schematic sectional view of a transparent substrate according to still another embodiment of the present invention.

FIG. 1(c) is a schematic sectional view of a transparent substrate according to still another embodiment of the present invention. In this embodiment, a transparent substrate 102 further includes a second resin layer 13, 13' between the first resin layer 11, 11' and the coupling agent layer 12, 12' (the inorganic glass 10 when no coupling agent layer is provided).

The transparent substrate of the present invention may include any appropriate other layer as an outermost layer, if required. Examples of the other layer include a hard coat layer and a transparent conductive layer.

The transparent substrate of the present invention has a total thickness of preferably 150 μm or less, more preferably 120 μm or less, particularly preferably 50 μm to 120 μm. According to the present invention, the thickness of the inorganic glass can be made much smaller than that of a conventional glass substrate by virtue of the presence of the first resin layer as described above. That is, the first resin layer can contribute to improvements in impact resistance and toughness even when the first resin layer is thin. Accordingly, a transparent substrate having a light weight, a small thickness, and excellent impact resistance is obtained.

The transparent substrate of the present invention has excellent durability against a solvent to be used upon production of a display device, a solar cell, or a lighting device. Specifically, the transparent substrate of the present invention is such that no solvent crack occurs when a mixed solvent containing 20 wt % to 95 wt % of at least one kind of solvent selected from the group consisting of acetone, N-methylpyrrolidone, dimethyl sulfoxide, and N,N-dimethylformamide is brought into contact with the substrate. The transparent substrate of the present invention is preferably such that no solvent crack occurs when a mixed solvent containing 70 wt % to 95 wt % of at least one kind of solvent selected from the group consisting of acetone, N-methylpyrrolidone, dimethyl sulfoxide, and N,N-dimethylformamide is brought into contact with the substrate. The transparent substrate of the present invention is more preferably such that no solvent crack occurs when a mixed solvent containing 90 wt % to 95 wt % of at least one kind of solvent selected from the group consisting of acetone, N-methylpyrrolidone, dimethyl sulfoxide, and N,N-dimethylformamide is brought into contact with the substrate. A solvent except acetone, N-methylpyrrolidone, dimethyl sulfoxide, and N,N-dimethylformamide in the mixed solvent is, for example, water or isopropyl alcohol. It should be noted that the term "solvent crack" as used herein refers to a crack that occurs when the transparent substrate is left to stand under room temperature for 5 minutes after the mixed solvent has been dropped to its outermost layer (that is, the first resin layer).

The transparent substrate of the present invention has a rupture diameter, which is determined when the transparent substrate is cracked and bent, of preferably 50 mm or less, more preferably 40 mm or less, particularly preferably 25 mm or less. The transparent substrate of the present invention includes a specific resin layer and thus exhibits excellent flexibility (for example, a rupture diameter in the above-mentioned range).

The total light transmittance of the transparent substrate of the present invention is preferably 80% or more, more preferably 85% or more. The reduction ratio of light transmittance of the transparent substrate after the heating treatment at 180° C. for 2 hours is preferably within 5%. This is because, with such reduction ratio, the practically allowable light transmittance can be kept, even if a heating treatment required in a production process of FPDs and solar cells is conducted.

A surface roughness Ra (substantially, a surface roughness Ra of the first resin layer or the other layer) of the transparent substrate of the present invention is preferably 50 nm or less, more preferably 30 nm or less, particularly preferably 10 nm or less. The wave of the transparent substrate is preferably 0.5 μm or less, more preferably 0.1 μm or less. The transparent substrate with such characteristics is excellent in quality. Such characteristics can be realized, for example, by a production method described later.

The transparent substrate of the present invention has a coefficient of linear expansion of preferably 15 ppm/° C. or less, more preferably 10 ppm/° C. or less, particularly preferably 1 ppm/° C. to 10 ppm/° C. The transparent substrate shows excellent dimensional stability (e.g., a coefficient of linear expansion within such a range as described above) because the transparent substrate has the inorganic glass. To be additionally specific, the inorganic glass itself is stiff, and fluctuations in dimensions of the first resin layer can be suppressed because the first resin layer is restrained by the inorganic glass. As a result, the entirety of the transparent substrate shows excellent dimensional stability.

B. Inorganic Glass

As the inorganic glass used in the transparent substrate of the present invention, any appropriate glass can be adopted as long as the glass is in a plate shape. Examples of the inorganic glass include soda-lime glass, borate glass, aluminosilicate glass, and quartz glass according to the classification based on a composition. Further, according to the classification based on an alkali component, no-alkali glass and low alkali glass are exemplified. The content of an alkali metal component (e.g., $Na_2O$, $K_2O$, $Li_2O$) of the inorganic glass is preferably 15 wt % or less, more preferably 10 wt % or less.

The thickness of the inorganic glass is preferably 80 μm or less, more preferably 20 μm to 80 μm, particularly preferably 30 μm to 70 μm. In the present invention, the thickness of the inorganic glass can be reduced by providing a resin layer on one side, or each of both sides, of the inorganic glass.

The light transmittance of the inorganic glass at a wavelength of 550 nm is preferably 85% or more. A refractive index $n_g$ of the inorganic glass at a wavelength of 550 nm is preferably 1.4 to 1.65.

The density of the inorganic glass is preferably 2.3 $g/cm^3$ to 3.0 $g/cm^3$, more preferably 2.3 $g/cm^3$ to 2.7 $g/cm^3$. With the inorganic glass in the above-mentioned range, a light-weight transparent substrate is obtained.

As a method of forming the inorganic glass, any appropriate method can be adopted. Typically, the inorganic glass is produced by melting a mixture containing a main material such as silica and alumina, an antifoaming agent such as salt cake and antimony oxide, and a reducing agent such as carbon at a temperature of 1400° C. to 1600° C. to form a thin plate, followed by cooling. Examples of the method of forming a thin plate of the inorganic glass include a slot down draw method, a fusion method, and a float method. The inorganic glass formed into a plate shape by those methods may be chemically polished with a solvent such as hydrofluoric acid, if required, in order to reduce the thickness and enhance smoothness.

As the inorganic glass, commercially available inorganic glass may be used as it is, or commercially available inorganic glass may be polished so as to have a desired thickness. Examples of the commercially available inorganic glass include "7059," "1737," or "EAGLE 2000" each manufactured by Corning Incorporated, "AN100", manufactured by Asahi Glass Co., Ltd., "NA-35" manufactured by NH Technoglass Corporation, "OA-10" manufactured by Nippon Electric Glass Co., Ltd., and "D263" or "AF45" each manufactured by SCHOTT AG.

C. First Resin Layer

The first resin layer to be used in the transparent substrate of the present invention is placed on at least one side of the inorganic glass. The first resin layer preferably contains a resin compound having repeating units represented by the following general formulae (1), (2), and (3). Providing the resin layer containing such resin compound can result in a transparent substrate excellent in solvent crack resistance. In addition, the incorporation of such resin compound provides a resin layer excellent in toughness. As a result, such a transparent substrate that a crack hardly progresses at the time of its cutting can be obtained.

[Chem.3]

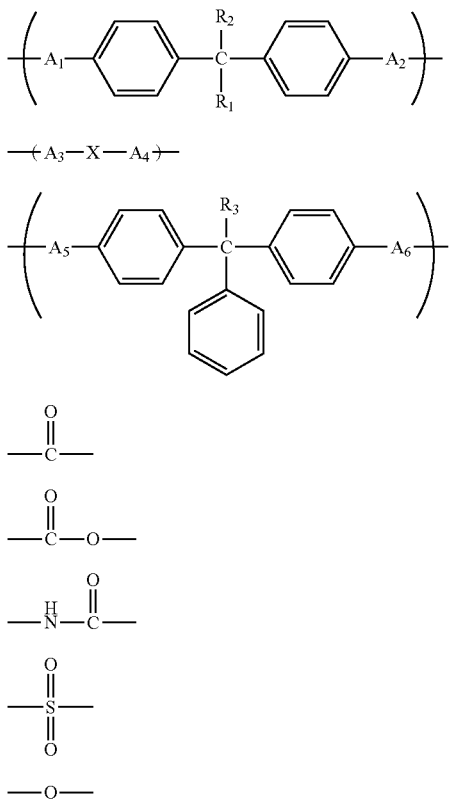

In the formula (1), $R_1$ represents preferably a linear or branched alkyl group having 1 to 5 carbon atoms, more preferably a linear or branched alkyl group having 1 to 3 carbon atoms, particularly preferably a methyl group, $R_2$ represents preferably a linear or branched alkyl group having 2 to 5 carbon atoms, more preferably a linear or branched alkyl group having 3 or 4 carbon atoms, particularly preferably an isobutyl group, and $A_1$ and $A_2$ each independently represent an oxygen atom, a single bond, or a linking group represented by the general formula (5).

In the formula (2), X represents preferably a substituted or unsubstituted arylene group having 6 to 18 carbon atoms, more preferably a substituted or unsubstituted arylene group having 6 to 12 carbon atoms, and $A_3$ and $A_4$ each independently represent preferably at least one kind selected from linking groups represented by the general formulae (4) to (8), more preferably the linking group represented by the general formula (4) or the general formula (5).

In the formula (3), $R_3$ represents preferably a methyl group, or a substituted or unsubstituted aryl group having 6 to 18 carbon atoms, more preferably a methyl group, or a substituted or unsubstituted aryl group having 6 to 12 carbon atoms, and $A_5$ and $A_6$ preferably each independently represent an oxygen atom, a single bond, or the linking group represented by the general formula (5).

$A_3$ and $A_4$ in the general formula (2) are preferably bonded to the para positions or meta positions of the X. The number of $A_3$'s and $A_4$'s bonded to the para positions of the X's is preferably three or more times, more preferably four or more times, particularly preferably nine or more times as large as the number of $A_3$'s and $A_4$'s bonded to the meta positions of the X's. The $A_3$ and the $A_4$ are most preferably bonded only to the para positions of the X. The use of the resin compound having the repeating unit represented by the general formula (3) of such structure can provide a transparent substrate excellent in solvent crack resistance.

A molar ratio (general formula (3)/general formula (1)) between the repeating unit represented by the general formula (1) and the repeating unit represented by the general formula (3) is preferably 0.5 to 2.0, more preferably 0.7 to 1.6.

A molar ratio (other than general formula (2)/general formula (2)) between the repeating unit represented by the general formula (2) and the repeating units other than the repeating unit represented by the general formula (2) is preferably 0.7 to 1.3, more preferably 0.9 to 1.1.

A monomer for constructing the repeating unit represented by the general formula (1) is, for example, 4,4'-(1,3-dimethylbutylidene)bisphenol, 2,2-bis(4-hydroxyphenyl)-4-methyl-pentane, 3,3-bis(4-hydroxyphenyl)pentane, or 2,2-bis(4'-hydroxyphenyl)hexane. A monomer for constructing the repeating unit represented by the general formula (2) is, for example, 4,4'-(1-phenylethylidene)bisphenol, 4,4'-(1-phenylpropylidene)bisphenol, 4,4'-(1-phenylpentylidene)bisphenol, or 4,4'-(1-phenylhexylidene)bisphenol. A monomer for constructing the repeating unit represented by the general formula (3) is, for example, terephthaloyl chloride, isophthaloyl chloride, phthaloyl chloride, or biphenyldicarboxylic acid chloride. The resin compound having the repeating units represented by the general formulae (1), (2), and (3) can be obtained by copolymerizing those monomers by any appropriate polymerization method. One kind of those monomers can be used alone, or two or more kinds thereof can be used as a mixture. A polymerization solvent is, for example, a halogen-based solvent such as chloroform, methylene chloride, or trichloroethane, or an aromatic hydrocarbon-based solvent such as toluene or xylene. Of those, toluene is preferred. The use of toluene can provide the transparent substrate at a low cost.

The resin compound preferably further has a repeating unit represented by the following general formula (9). As long as the resin compound has such repeating unit, a transparent substrate excellent in heat resistance can be obtained.

[Chem. 4]

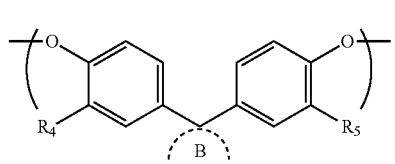

In the formula (9), $R_4$ and $R_5$ preferably each independently represent a methyl group or hydrogen, and B represents preferably a substituted or unsubstituted cycloalkane having 4 to 9 carbon atoms, or a substituted or unsubstituted fluorene, more preferably a substituted or unsubstituted cycloalkane having 6 to 9 carbon atoms, or a substituted or unsubstituted fluorene.

The resin compound further having the repeating unit represented by the general formula (9) can be obtained by polymerizing, for example, bisphenols each having a fluorene group or bisphenols each having a cyclohexane group with the monomer. One kind of those monomers can be used alone, or two or more kinds thereof can be used as a mixture. The bisphenol having a fluorene group is specifically, for example, 9,9-bis(4-hydroxy-3-methylphenyl)fluorene. The bisphenol having a cyclohexane group is specifically, for example, 4,4'-(3,3,5-trimethylcyclohexylidene)bisphenol.

The ratio of the repeating unit represented by the general formula (9) is preferably 30 mol % or less, more preferably 3 mol % to 30 mol %, particularly preferably 5 mol % to 20 mol % with respect to the total number of moles of the repeating units represented by the general formulae (1) to (3).

The polymerization degree of the resin compound for constructing the first resin layer is preferably 10 to 6,000, more preferably 20 to 5,000, particularly preferably 50 to 4,000.

The weight-average molecular weight of the resin compound for constructing the first resin layer is preferably $8 \times 10^4$ to $100 \times 10^4$, more preferably $9 \times 10^4$ to $50 \times 10^4$, particularly preferably $10 \times 10^4$ to $30 \times 10^4$ in terms of polystyrene. When the weight-average molecular weight of the resin compound for constructing the first resin layer is smaller than $8 \times 10^4$, a transparent substrate having desired solvent crack resistance may not be obtained. When the weight-average molecular weight is larger than $100 \times 10^4$, the compound may have so high a viscosity as to be difficult to handle.

The glass transition temperature of the resin compound for constructing the first resin layer is preferably 180° C. to 350° C., more preferably 230° C. to 330° C., particularly preferably 250° C. to 300° C., most preferably 260° C. to 300° C. As long as the temperature falls within such range, a transparent substrate excellent in heat resistance can be obtained.

The resin compound for constructing the first resin layer is preferably soluble in a solvent containing 50% or more of toluene and/or xylene, is more preferably soluble in a solvent containing 70% or more of toluene and/or xylene, and is particularly preferably soluble in a solvent containing 80% or more of toluene and/or xylene. As long as the resin compound for constructing the first resin layer is soluble in such solvent, when a solution containing the resin compound is applied to the inorganic glass so that the transparent substrate may be obtained, the applying step can be easily performed.

The first resin layer has a modulus of elasticity of preferably 1.5 GPa to 10 GPa, more preferably 1.6 GPa to 9 GPa, particularly preferably 1.7 GPa to 8 GPa. As long as the modulus of elasticity falls within the range, even when the inorganic glass is made thin, the first resin layer alleviates a local stress in the direction in which the inorganic glass is torn toward a defect generated at the time of the deformation. Accordingly, the inorganic glass hardly cracks or ruptures.

The first resin layer has a fracture toughness value of preferably 1.5 MPa·m$^{1/2}$ to 10 MPa·m$^{1/2}$, more preferably 2 MPa·m$^{1/2}$ to 8 MPa·m$^{1/2}$, particularly preferably 2.5 MPa·m$^{1/2}$ to 6 MPa·m$^{1/2}$. As long as the fracture toughness value falls within such range, the first resin layer has sufficient toughness, and hence a transparent substrate in which the progress of a crack in the inorganic glass and the rupture of the inorganic glass may be prevented and which is excellent in flexibility can be obtained.

The first resin layer has a total light transmittance of preferably 85% or more, more preferably 87% or more, particularly preferably 88% or more.

The first resin layer preferably has a refractive index ($n_r$) at a wavelength of 550 nm of 1.5 to 1.8.

The first resin layer has a thickness of preferably 1 μm to 60 μm, more preferably 1 μm to 40 μm.

When the first resin layers are placed on both sides of the inorganic glass, the respective first resin layers may have the same or different thicknesses. The respective first resin layers preferably have the same thickness. In addition, the respective first resin layers may be formed of resin compounds of the same composition, or may be formed of resin compounds of different compositions. It is preferred that the respective first resin layers be formed of resin compounds of the same composition. Thus, it is most preferred that the respective first resin layers be formed of resin compounds of the same composition so as to have the same thickness. In such configuration, a heat stress is uniformly applied on both surfaces of the inorganic glass even in the case of carrying out heating treatment, and hence warping and waviness are very hard to occur.

The first resin layer can further contain any appropriate additive depending on purposes. Examples of the additive include a diluent, an antioxidant; a denaturant, a surfactant, a dye, a pigment, a discoloration preventing agent, a UV absorber, a softening agent, a stabilizer, a plasticizer, an antifoaming agent, and a stiffener. The kind, number, and amount of an additive to be incorporated in the resin composition can be set appropriately depending on purposes.

D. Adhesive Layer

Any appropriate resin can be adopted as a material for constructing the adhesive layer. Examples of the material for constructing the adhesive layer include a thermosetting resin and an active energy ray-curable resin. Specific examples of such resins include: epoxy-based resins containing epoxies and/or oxetanes; acrylic resins; and silicone-based resins. Of those, an epoxy-based resin excellent in heat resistance is preferred. It should be noted that one kind of those resins may be used alone, or two or more kinds thereof may be used in combination. As the epoxies, any appropriate epoxy can be used as long as the epoxy has an epoxy group in any one of its molecules. Examples of the epoxies include epoxy-based resins including bisphenol types such as a bisphenol A type, a bisphenol F type, a bisphenol S type, and a hydrogenated substance thereof; novolac types such as a phenol novolac type and a cresol novolac type; nitrogen-containing cyclic types such as a triglycidylisocyanurate type and a hydantoin type; alicyclic types; aliphatic types; aromatic types such as a naphthalene type and a biphenyl type; glycidyl types such as a glycidyl ether type, a glycidyl amine type, and a glycidyl ester type; dicyclo types such as a dicyclopentadiene type; ester types; ether ester types; and modified types thereof. One kind of these epoxies may be used alone, or two or more kinds of them may be used as a mixture. The epoxies are preferably a bisphenol A type, an alicyclic type, a nitrogen-containing cyclic type, or a glycidyl type. Examples of the oxetanes include 3-ethyl-3-hydroxymethyloxetane (oxetane alcohol), 2-ethylhexyloxetane, xylylenebisoxetane, and 3-ethyl-3 (((3-ethyloxetane-3-yl)methoxy)methyl)oxetane.

The adhesive layer has a heat decomposition temperature of preferably 170° C. or more, more preferably 180° C. or more, particularly preferably 200° C. or more, most preferably 200° C. to 350° C. As long as the temperature falls within such range, a transparent substrate excellent in heat resistance can be obtained.

The adhesive layer has a thickness of preferably 10 μm or less, more preferably 0.01 μm to 10 μm, particularly preferably 0.1 μm to 7 μm. As long as the thickness of the adhesive layer falls within such range, excellent adhesiveness between the inorganic glass and the first resin layer can be realized without the impairment of the flexibility of the transparent substrate.

E. Coupling Agent Layer

The transparent substrate of the present invention preferably further includes a coupling agent layer between the first resin layer and the inorganic glass. It is more preferred that the coupling agent layer be directly placed on the inorganic glass:

The coupling agent is, for example, at least one kind of coupling agent selected from the group consisting of an epoxy group-containing coupling agent, an amino group-containing coupling agent, and an isocyanate group-containing coupling agent. Each of the substitution positions of the amino group, the epoxy group, and the isocyanate group which those coupling agents have may be a molecular terminal or may not be the terminal. The use of such coupling agent enables the first resin layer to strongly adhere to the inorganic glass through the coupling agent layer.

Specific examples of the epoxy group-containing coupling agent include 2-(3,4-epoxycyclohexyl)ethyltrimethoxysilane, 3-glycidoxypropyltrimethoxysilane, 3-glycidoxypropylmethyldiethoxysilane, and 3-glycidoxypropyltriethoxysilane.

The amino group-containing coupling agent is preferably an alkoxy silane having an amino group or a halogenated silane having an amino group, and particularly preferably an alkoxy silane having an amino group.

Specific examples of the alkoxy silane having an amino group include 3-aminopropyltrimethoxysilane, 3-aminopropylmethyldimethoxysilane, 3-aminopropyldimethylmethoxysilane, 3-aminopropyltriethoxy silane, 3-aminopropylmethyldiethoxysilane, 3-aminopropylmethyldimethoxysilane, 6-aminohexyltrimethoxysilane, 6-aminohexyltriethoxysilane, 11-aminoundecyltrimethoxysilane, 11-aminoundecyltriethoxysilane, and 3-triethoxysilyl-N-(1,3-dimethyl-butylidene)propylamine.

Specific examples of the halogenated silane having an amino group include 3-aminopropyltrichlorosilane, 3-aminopropylmethyldichlorosilane, 3-aminopropyldimethylchlorosilane, 6-aminohexyltrichlorosilane, and 11-aminoundecyltrichlorosilane.

Specific examples of the isocyanate group-containing coupling agent include 3-isocyanatepropyltriethoxysilane.

The coupling agent may be a commercially available coupling agent. Examples of commercially available epoxy group-containing coupling include trade name "KBM-303" (2-(3,4-epoxycyclohexyl)ethyltrimethoxysilane), trade name "KBM-403" (3-glycidoxypropyltrimethoxysilane), trade name "KBE-402" (3-glycidoxypropylmethyldiethoxysilane), and trade name "KBE-403" (3-glycidoxypropyltriethoxysilane), all of which are manufactured by Shin-Etsu Chemical Co., Ltd. Examples of commercially available amino group-containing coupling agents include trade name "KBM-602" (N-2-(aminoethyl)-3-aminopropylmethyldimethoxysilane), trade name "KBM-603" (N-2-(aminoethyl)-3-aminopropyltrimethoxysilane), trade name "KBE-603" (N-2-(aminoethyl)-3-aminopropyltriethoxysilane), trade name "KBM-903" (3-aminopropyltrimethoxysilane), trade name "KBE-903" (3-aminopropyltriethoxysilane), trade name "KBM-573" (N-phenyl-3-aminopropyltrimethoxysilane), and trade name "KBE-9103" (3-triethoxysilyl-N-(1,3-dimethyl-butylidene)propylamine), all of which are manufactured by Shin-Etsu Chemical Co., Ltd. Examples of commercially available isocyanate group-containing coupling agents include trade name "KBE-9007" (3-isocyanatepropyltriethoxysilane) manufactured by Shin-Etsu Chemical Co., Ltd.

The thickness of the coupling agent layer is preferably 0.001 μm to 10 μm, more preferably 0.001 μm to 2 μm.

F. Second Resin Layer

In one embodiment, the transparent substrate of the present invention further includes a second resin layer between the inorganic glass and the first resin layer. As long as the second resin layer is provided, the second resin layer and the first resin layer are compatible with each other upon formation of the first resin layer by solution application. Accordingly, a transparent substrate having high adhesiveness therebetween can be easily obtained.

The second resin layer contains a thermoplastic resin and an epoxy group-terminated coupling agent. The thermoplastic resin is a thermoplastic resin capable of reacting with the coupling agent in the coupling agent layer and/or the epoxy group-terminated coupling agent in the second resin layer. Such thermoplastic resin is, for example, a thermoplastic resin having a hydroxyl group at a terminal thereof.

Specific examples of the thermoplastic resin having a hydroxyl group at a terminal thereof include thermoplastic resins obtained by modifying terminals of polyethersulfone, polyimide, polyimide-amide, polyetherimide, polysulfone, polyarylate, polycarbonate, and the like with hydroxyl groups. Those thermoplastic resins may be used alone, or two or more kinds thereof may be used as a mixture. Such thermoplastic resin may be used to provide a resin layer which is excellent in adhesiveness to the inorganic glass or the coupling agent layer even under a high-temperature, high-humidity environment and which is also excellent in toughness. Such resin layer excellent in toughness may be used to provide a transparent substrate which hardly causes the progress of a crack during cutting. It should be noted that any appropriate method may be used for the modification of the terminals with hydroxyl groups.

The hydroxyl group present at the terminal is preferably a phenolic hydroxyl group. When the thermoplastic resin having a hydroxyl group at a terminal thereof has a phenolic hydroxyl group at the terminal, a strong interaction with the epoxy group-terminated coupling agent in the second resin layer is obtained.

The content of the hydroxyl group is preferably 0.3 or more, more preferably 0.5 to 2.0 per a polymerization degree of the thermoplastic resin having a hydroxyl group at a terminal thereof of 100. As long as the content of the hydroxyl group falls within such range, an excellent interaction with the epoxy group-terminated coupling agent can be obtained.

A commercially available thermoplastic resin having a hydroxyl group at a terminal thereof may be used as the thermoplastic resin having a hydroxyl group at a terminal thereof. The commercially available thermoplastic resin having a phenolic hydroxyl group at a terminal thereof is, for example, "SUMIKAEXCEL 5003P" manufactured by Sumitomo Chemical Co., Ltd.

The thermoplastic resin in the second resin layer has a glass transition temperature of preferably 180° C. or more, more preferably 200° C. or more, particularly preferably 220° C. or more, most preferably 220° C. to 350° C. As long as the temperature falls within such range, a transparent substrate excellent in heat resistance can be obtained.

The epoxy group-terminated coupling agent is, for example, an epoxy group-containing coupling agent having an epoxy group at a terminal thereof described in the section E.

The content of the epoxy group-terminated coupling agent is preferably 10 parts by weight to 50 parts by weight, more preferably 15 parts by weight to 40 parts by weight, still more preferably 20 parts by weight to 35 parts by weight with respect to 100 parts by weight of the thermoplastic resin in the second resin layer. Setting the content of the epoxy group-terminated coupling agent within the range can sufficiently improve the adhesiveness between the inorganic glass and the resin layer. Further, a transparent substrate having a desired haze value is obtained even when the total thickness of the transparent substrate is increased.

The second resin layer preferably further contains a cyclic ether compound and/or a compound obtained by the ring-opening of the cyclic portion of a cyclic ether compound. As long as the second resin layer contains the cyclic ether compound and/or the compound obtained by the ring-opening of the cyclic portion of a cyclic ether compound, the second resin layer and the coupling agent layer or the inorganic glass can be caused to stably adhere to each other. Accordingly, the transparent substrate can be obtained in high yield.

Any appropriate compound can be used as the cyclic ether compound, and examples thereof include: four-membered cyclic ether compounds such as oxetanes; five-membered cyclic ether compounds such as tetrahydrofurans; six-membered cyclic ether compounds such as tetrahydropyrans; and epoxies. A compound obtained by the ring-opening of any appropriate cyclic ether compound can be used as the compound obtained by the ring-opening of the cyclic portion of a cyclic ether compound, and examples thereof include compounds obtained by the ring-opening of the cyclic ether compounds. Any appropriate method is employed as a method for the ring-opening of a cyclic ether compound.

The content of the cyclic ether compound and/or the compound obtained by the ring-opening of the cyclic portion of a cyclic ether compound is preferably 5 parts by weight to 50 parts by weight, more preferably 5 parts by weight to 30 parts by weight, still more preferably 5 parts by weight to 20 parts by weight with respect to 100 parts by weight of the thermoplastic resin having a hydroxyl group at a terminal thereof. Setting the content of the cyclic ether compound and/or the compound obtained by the ring-opening of the cyclic portion of a cyclic ether compound within the range can suppress the coloring of the resin layer derived from the cyclic ether compound under heating.

The second resin layer preferably has a transmittance at a wavelength of 550 nm of 80% or more. The second resin layer preferably has a refractive index ($n_r$) at a wavelength of 550 nm of 1.5 to 1.8.

The second resin layer has a modulus of elasticity of preferably 1 GPa or more, more preferably 1.5 GPa or more. As long as the modulus of elasticity falls within the range, even when the inorganic glass is made thin, the second resin layer alleviates a local stress in the direction in which the inorganic glass is torn toward a defect generated at the time of the deformation. Accordingly, the inorganic glass hardly cracks or ruptures.

The second resin layer has a fracture toughness value of preferably 1 MPa·m$^{1/2}$ to 10 MPa·m$^{1/2}$, more preferably 1.5 MPa·m$^{1/2}$ to 6 MPa·m$^{1/2}$.

The second resin layer preferably has a thickness of 20 μm or less. Setting the thickness of the second resin layer within the range provides sufficient adhesiveness between the inorganic glass or the coupling agent layer and the first resin layer even under a high-temperature, high-humidity environment. The thickness of the second resin layer is more preferably 0.001 μm to 20 μm, still more preferably 0.001 μm to 15 μm, particularly preferably 0.01 μm to 10 μm. As long as the thickness falls within the preferred range, a transparent substrate that satisfies sufficient transparency can be obtained.

When the second resin layers are placed on both sides of the inorganic glass, the respective second resin layers may have the same or different thicknesses. The respective second resin layers preferably have the same thickness. In addition, the respective second resin layers may be formed of resin compounds of the same composition, or may be formed of resin compounds of different compositions. It is preferred that the respective second resin layers be formed of resin compounds of the same composition. Thus, it is most preferred that the respective second resin layers be formed of resin compounds of the same composition so as to have the same thickness. In such configuration, a heat stress is uniformly applied on both surfaces of the inorganic glass even in the case of carrying out heating treatment, and hence warping and waviness are very hard to occur.

The second resin layer can further contain any appropriate additive depending on purposes. The same additive as that for the first resin layer described in the section C can be used as the additive.

G. Other Layer

The transparent substrate can include any appropriate other layer as an outermost layer, if required. Examples of the other layer include a transparent conductive layer and a hard coat layer.

The transparent conductive layer can function as an electrode or an electromagnetic wave shield.

A material that can be used in the transparent conductive layer is, for example, a metal such as copper or silver, a metal oxide such as an indium tin oxide (ITO) or an indium zinc oxide (IZO), a conductive polymer such as a polythiophene or a polyaniline, or a composition containing a carbon nanotube.

The hard coat layer has a function of imparting chemical resistance, abrasion resistance, and surface smoothness to the transparent substrate.

Any appropriate material can be adopted as a material of which the hard coat layer is formed. Examples of the material of which the hard coat layer is formed include epoxy-based resins, acrylic resins, silicone-based resins, and mixtures of these resins. Of those, the epoxy-based resins each of which is excellent in heat resistance are preferred. The hard coat layer can be obtained by curing any such resin with heat or an active energy ray.

H. Method of Producing Transparent Substrate

The transparent substrate of the present invention can be obtained by forming the first resin layer on the inorganic glass by any appropriate method. Examples of the method of forming the first resin layer include a method based on solution application and a method involving attaching a resin film onto the inorganic glass through an adhesive layer (hereinafter, sometimes referred to as "method based on resin film attachment").

H-1. Method Based on Solution Application

The method of forming the first resin layer by solution application is, for example, a method involving (i) directly applying a casting solution for the second resin layer containing the thermoplastic resin having a hydroxyl group at a terminal thereof and the epoxy group-terminated coupling agent to the surface of the inorganic glass to form the second resin layer, and (ii) directly applying a casting solution for the first resin layer containing the resin compound described in the section C onto the second resin layer to form the first resin layer.

A method of forming the second resin layer is formed of: an applying step of applying the casting solution for the second resin layer to one side, or each of both sides, of the inorganic glass to form an applied layer; a drying step of drying the applied layer; and a heat treatment step of subjecting the applied layer after the drying to a heat treatment. The casting solution for the second resin layer preferably further contains the cyclic ether compound and/or the compound obtained by the ring-opening of the cyclic portion of a cyclic ether compound. The contents of the thermoplastic resin having a hydroxyl group at a terminal thereof, the epoxy group-terminated coupling agent, and the cyclic ether compound and/or the compound obtained by the ring-opening of the cyclic portion of a cyclic ether compound in the casting solution for the second resin layer are as described above.

An application solvent to be used at the time of the applying step is, for example, a ketone-based solvent, a halogen-based solvent, an aromatic solvent, a high-polarity solvent, or a mixture thereof. Examples of the ketone-based solvent include methyl ethyl ketone, methyl isobutyl ketone, cyclopentanone, and cyclohexanone. Examples of the halogen-based solvent include methylene chloride, ethylene chloride, chloroform, carbon tetrachloride, and trichloroethane. Examples of the aromatic solvent include toluene, xylene, benzene, and phenol. Examples of the high-polarity solvent include dimethyl sulfoxide, N-methylpyrrolidone, dimethylformamide, and ethyl acetoacetate.

Any appropriate method can be employed as a method of applying a casting solution for the second resin layer, and examples thereof include: coating methods such as air doctor coating, blade coating, knife coating, reverse coating, transfer roll coating, gravure roll coating, kiss coating, cast coating, spray coating, slot orifice coating, calender coating, electrodeposition coating, dip coating, and die coating; and printing methods including relief printings such as flexographic printing, intaglio printings such as direct gravure printing and offset gravure printing, planographic printings such as offset printing, and stencil printings such as screen printing.

The second resin layer is preferably obtained by applying a casting solution for the second resin layer and then drying the applied layer. Any appropriate method for drying (for example, natural drying, forced-air drying, or heat drying) may be employed as a method for the drying. For example, in the case of heat drying, a drying temperature is typically 100° C. to 200° C. and a drying time is typically 1 to 30 minutes. The epoxy group-terminated coupling agent and the thermoplastic resin having a hydroxyl group at a terminal thereof may be subjected to a reaction during the drying.

Any appropriate method for heat treatment may be employed as a method for heat treatment of the second resin layer. Typically, a heat treatment temperature is 50° C. to 180° C. and a heat treatment time is 1 to 20 minutes. The heat treatment allows the epoxy group-terminated coupling agent to be bonded to the inorganic glass surface through a chemical bond.

Next, a first resin layer is formed by directly applying a casting solution for the first resin layer onto the second resin layer formed by the above-mentioned method. The first resin layer may be formed using the same method as the forming method for the second resin layer described above. Specifically, a forming method for the first resin layer is formed of: an applying step of applying the casting solution for the first resin layer onto the second resin layer to form an applied layer; and a drying step of drying the applied layer. The applying step is the same as described above and hence the detailed description thereof is omitted.

Any appropriate method for drying (for example, natural drying, forced-air drying, or heat drying) may be employed as a method for the drying of the first resin layer. For example, in the case of heat drying, a drying temperature is typically 80° C. to 150° C. and a drying time is typically 1 to 30 minutes.

The method of producing the transparent substrate of the present invention preferably includes: a drying step of further drying the first resin layer and second resin layer formed; and a heat treatment step of subjecting the first resin layer and second resin layer after the drying to a heat treatment. The method includes those steps and thus can provide a stronger chemical bond or interaction among the inorganic glass, the first resin layer, and the second resin layer. Any appropriate method as described above may be employed as a method for the drying. In the case of a method for heat drying, a drying temperature is typically 100° C. to 200° C. and a drying time is typically 1 to 30 minutes. Any appropriate method for heat treatment may be employed as a method for the heat treatment. Typically, a heat treatment temperature is 50° C. to 180° C. and a heat treatment time is 1 to 20 minutes.

The method of producing the transparent substrate of the present invention preferably includes subjecting the surface of the inorganic glass to a coupling treatment before the formation of the second resin layer. The coupling agent is as described in the section E.

Any appropriate method can be adopted as a method for the coupling treatment. The method is specifically, for example, a method involving applying a solution of the coupling agent to the surface of the inorganic glass and subjecting the resultant to a heat treatment.

Any appropriate solvent can be used as a solvent to be used upon preparation of the solution of the coupling agent as long as the solvent does not react with the coupling agent. Examples of the solvent include: aliphatic hydrocarbon-based solvents such as hexane and hexadecane; aromatic solvents such as benzene, toluene, and xylene; halogen hydrocarbon-based solvents such as methylene chloride and 1,1,2-trichloroethane; ether-based solvents such as tetrahydrofuran and 1,4-dioxane; alcohol-based solvents such as methanol and propanol; ketone-based solvents such as acetone and 2-butanone; and water.

Any appropriate heat treatment method can be adopted as the heat treatment method at the time of the coupling treatment. Representatively, a heat treatment temperature is 50° C. to 150° C. and a heat treatment time is 1 minute to 10 minutes. The heat treatment enables the coupling agent and the surface of the inorganic glass to be bonded to each other through a chemical bond.

H-2. Method Based on Resin Film Attachment

The method of forming the first resin layer based on the attachment of the resin film onto the inorganic glass through the adhesive layer preferably includes: a film-forming step including applying the solution of the resin compound described in the section C onto a base material having stiffness and drying the applied solution to form the resin film; an attaching step of attaching the resin film to one side, or each of both sides, of the inorganic glass through an adhesive precursor layer; and an adhesive-curing step of curing the adhesive precursor layer by active energy ray irradiation or a heating treatment to form the adhesive layer. Alternatively, the inorganic glass may be subjected to a coupling treatment before the attachment of the thermoplastic resin film. Such method as described above can be adopted as a method for the coupling treatment.

The same solvent as the application solvent that can be used in the applying step of the method based on solution application can be adopted as an application solvent in the film-forming step. The same method as the application method that can be employed in the applying step of the method based on solution application can be adopted as an application method. The same method as the drying method that can be employed in the drying step of the method based on solution application can be adopted as a drying method.

The thermoplastic resin film may be attached to the inorganic glass after having been peeled from the base material, or may be attached to the inorganic glass by being transferred from the base material. In addition, the thermoplastic resin film may be subjected to an annealing treatment before its attachment to the inorganic glass or after the attachment. Performing the annealing treatment can efficiently remove impurities such as a remaining solvent and an unreacted monomer component. A temperature for the annealing treatment is preferably 100° C. to 200° C. In addition, a treatment time for the annealing treatment is preferably 5 minutes to 20 minutes.

A resin described in the section D can be used as a material for constructing the adhesive precursor layer.

In the attaching step, the adhesive precursor may be applied onto the thermoplastic resin film before the adhesive precursor layer and the inorganic glass are attached to each other, or the adhesive precursor may be applied onto the inorganic glass before the adhesive precursor layer and the inorganic glass are attached to each other.

A method for the active energy ray irradiation is, for example, a method involving irradiating the adhesive precursor with UV light having an irradiation accumulated light quantity of 100 mJ/cm$^2$ to 2,000 mJ/cm$^2$ for 1 minute to 10 minutes.

Representative conditions for the heating treatment are a heating temperature of 100° C. to 200° C. and a heating time of 5 minutes to 30 minutes.

The method of producing the transparent substrate of the present invention further includes the step of forming any appropriate other layer on the first resin layer depending on intended uses. Examples of the other layer include the transparent conductive layer and the hard coat layer given in the section G. Any appropriate method can be employed as a method of forming the other layer.

I. Applications

The transparent substrate of the present invention may be used for any appropriate display device, solar cell, or lighting device. Examples of the display device include a liquid crystal display, a plasma display, an organic EL display, and electronic paper. The lighting device is, for example, an organic EL device.

EXAMPLES

Hereinafter, the present invention is described specifically by way of examples. However, the present invention is not limited to those examples. It should be noted that a thickness was measured using a digital micrometer "KC-351C type" manufactured by Anritsu Corporation.

Synthesis Example 1

In a reaction vessel provided with a stirring apparatus, 7.65 g (0.028 mol) of 4,4'-(1,3-dimethylbutylidene)bisphenol, 12.35 g (0.043 mol) of 4,4'-(1-phenylethylidene)bisphenol, 0.444 g of benzyltriethylammonium chloride, and 0.022 g of p-tertiarybutyl phenol were dissolved in 185 g of a 1-M solution of sodium hydroxide. A solution prepared by dissolving 14.4 g (0.071 mol) of terephthaloyl chloride in 246 g of chloroform was added to the resultant solution all at once while the latter solution was stirred, and then the mixture was stirred at room temperature for 120 minutes. After that, a chloroform solution containing a resin compound was separated by settled separation, and then the chloroform solution was sequentially washed with acetic acid water and ion-exchanged water. After that, the chloroform solution was charged into methanol so that the resin compound was deposited. The deposited resin compound was filtrated and dried under reduced pressure. Thus, 27 g of a white resin compound A were obtained.

Synthesis Example 2

In a reaction vessel provided with a stirring apparatus, 8.3 g (0.031 mol) of 4,4'-(1,3-dimethylbutylidene)bisphenol, 8.91 g (0.031 mol) of 4,4'-(1-phenylethylidene)bisphenol, 4.78 g (0.015 mol) of 4,4'-(3,3,5-trimethylcyclohexylidene)bisphenol, 0.488 g of benzyltriethylammonium chloride, and 0.024 g of p-tertiarybutyl phenol were dissolved in 204 g of a 1-M solution of sodium hydroxide. A solution prepared by dissolving 15.6 g (0.077 mol) of terephthaloyl chloride in 294 g of chloroform was added to the resultant solution all at once while the latter solution was stirred, and then the mixture was stirred at room temperature for 120 minutes. After that, a chloroform solution containing a resin compound was separated by settled separation, and then the chloroform solution was sequentially washed with acetic acid water and ion-exchanged water. After that, the chloroform solution was charged into methanol so that the resin compound was deposited. The deposited resin compound was filtrated and dried under reduced pressure. Thus, 32 g of a white resin compound B were obtained.

Synthesis Example 3

A white resin compound C was obtained in the same manner as in Synthesis Example 1 except that: toluene was used instead of chloroform; and benzyltributylammonium chloride was used instead of benzyltriethylammonium chloride.

Synthesis Example 4

In a reaction vessel provided with a stirring apparatus, 8.1 g (0.03 mol) of 4,4'-(1,3-dimethylbutylidene)bisphenol, 6.51 g (0.022 mol) of 4,4'-(1-phenylethylidene)bisphenol, 4.66 g (0.015 mol) of 4,4'-(3,3,5-trimethylcyclohexylidene)bisphenol, 2.9 g (0.008 mol) of 9,9-bis(4-hydroxy-3-methylphenyl)fluorene, 0.491 g of benzyltriethylammonium chloride, and 0.036 g of p-tertiarybutyl phenol were dissolved in 204 g of a 1-M solution of sodium hydroxide. A solution prepared by dissolving 15.2 g (0.075 mol) of terephthaloyl chloride in 288 g of chloroform was added to the resultant solution all at once while the latter solution was stirred, and then the mixture was stirred at room temperature for 120 minutes. After that, a chloroform solution containing a resin compound was separated by settled separation, and then the chloroform solution was sequentially washed with acetic acid water and ion-exchanged water. After that, the chloroform solution was charged into methanol so that the resin compound was deposited. The deposited resin compound was filtrated and dried under reduced pressure. Thus, 31 g of a white resin compound D were obtained.

Synthesis Example 5

In a reaction vessel provided with a stirring apparatus, 6 g (0.022 mol) of 4,4'-(1,3-dimethylbutylidene)bisphenol, 11.73 g (0.033 mol) of 4,4'-(1-diphenylmethylene)bisphenol, 0.394 g of benzyltriethylammonium chloride, and 0.019 g of p-tertiarybutyl phenol were dissolved in 164 g of a 1-M solution of sodium hydroxide. A solution prepared by dissolving 11.3 g (0.056 mol) of terephthaloyl chloride in 222 g of chloroform was added to the resultant solution all at once while the latter solution was stirred, and then the mixture was stirred at room temperature for 120 minutes. After that, a chloroform solution containing a resin compound was separated by settled separation, and then the chloroform solution was sequentially washed with acetic acid water and ion-exchanged water. After that, the chloroform solution was charged into methanol so that the resin compound was deposited. The deposited resin compound was filtrated and dried under reduced pressure. Thus, 22 g of a white resin compound E were obtained.

Synthesis Example 6

A white resin compound F was obtained in the same manner as in Synthesis Example 1 except that 7.2 g of terephthaloyl chloride and 7.2 g of isophthaloyl chloride were used instead of 14.4 g of terephthaloyl chloride.

Synthesis Example 7

A white resin compound G was obtained in the same manner as in Synthesis Example 1 except that 11.5 g of terephthaloyl chloride and 2.9 g of isophthaloyl chloride were used instead of 14.4 g of terephthaloyl chloride.

Synthesis Example 8

A white resin compound H was obtained in the same manner as in Synthesis Example 1 except that 7.65 g of bisphenol A was used instead of 7.65 g of 4,4'-(1,3-dimethylbutylidene) bisphenol.

Synthesis Example 9

A white resin compound I was obtained in the same manner as in Synthesis Example 1 except that: 19.40 g of 4,4'-(1,3-dimethylbutylidene)bisphenol were used instead of 7.65 g of 4,4'-(1,3-dimethylbutylidene)bisphenol; and 4,4'-(1-phenylethylidene)bisphenol was not used.

Synthesis Example 10

In a reaction vessel provided with a stirring apparatus, 5.73 g (0.021 mol) of 4,4'-(1,3-dimethylbutylidene)bisphenol, 12.35 g (0.043 mol) of 4,4'-(1-phenylethylidene)bisphenol, and 11.37 g (0.071 mol) of 1,4-dihydroxynaphthalene were partially dissolved and partially dispersed in 100 ml of a 2N solution of potassium hydroxide. 200 ml of methylene chloride were added to the solution thus obtained. Further, 10.58 g (0.107 mol) of a phosgene gas were blown into the mixture while the mixture was stirred under cooling. After that, the resultant was subjected to settled separation. Thus, a methylene chloride solution of an oligomer (having a polymerization degree of 2 to 5) having a chloroformate group at a terminal thereof was obtained from the organic phase. After that, methylene chloride was further added to 200 ml of the resultant methylene chloride solution so that the total amount of the methylene chloride solution was 300 ml. Next, a solution prepared by dissolving 1.92 g (0.007 mol) of 4,4'-(1,3-dimethylbutylidene)bisphenol in 50 ml of 2N potassium hydroxide and 0.05 g of p-tertiarybutyl phenol as a molecular weight modifier were added to the methylene chloride solution. Next, 0.8 ml of an aqueous solution of triethylamine having a concentration of 7% as a catalyst was added to the mixed liquid thus obtained while the mixed liquid was vigorously stirred. After that, the mixture was subjected to a reaction at 25° C. for 1.5 hours while being stirred. After the completion of the reaction, the resultant product was diluted with 1 L of methylene chloride and then washed with 1.5 L of water twice. Further, the washed product was washed with 0.05N hydrochloric acid and then washed with 1 L of water twice. After that, the organic phase was charged into methanol so that reprecipitation was performed. Thus, 20 g of a powdery white resin compound J were obtained.

Synthesis Example 11

In a reaction vessel provided with a stirring apparatus, a solution prepared by dissolving 3.51 g (0.013 mol) of 4,4'-(1,3-dimethylbutylidene)bisphenol, 6.38 g (0.022 mol) of 4,4'-(1-phenylethylidene)bisphenol, and 11.37 g (0.071 mol) of 1,4-phenylene diisocyanate in 100 ml of dimethylformamide was stirred at 120° C. under a nitrogen atmosphere. Thus, a reaction liquid containing a prepolymer was obtained. Next, 4.05 g (0.015 mol) of 4,4'-(1,3-dimethylbutylidene)bisphenol, a dimethylformamide solution of 6.09 g (0.021 mol) of 4,4'-(1-phenylethylidene)bisphenol, and 1.1 g of a dibutyltin dilaurate solution having a concentration of 1% as a catalyst were added to the reaction liquid, and then the mixture was stirred at 120° C. for 4 hours. After the completion of the reaction, the resultant reaction solution was charged into methanol so that reprecipitation was performed. Thus, 21 g of a powdery white resin compound K were obtained.

Example 1

36.2 g of a polyether sulfone having a hydroxyl group at a terminal thereof (SUMIKAEXCEL 5003P manufactured by Sumitomo Chemical Co., Ltd) were dissolved in a mixed solvent of 172 g of cyclopentanone and 10.8 g of N,N-dimethylformamide. Thus, a solution containing 16.5 wt % of the polyether sulfone having a hydroxyl group at a terminal thereof was obtained. 1.81 g of 3,4-epoxycyclohexenylmethyl-3',4'-epoxycyclohexene carboxylate (CELLOXIDE 2021P manufactured by Daicel Chemical Industries, Ltd.), 1.45 g of 3-ethyl-3{[(3-ethyloxetane-3-yl)methoxy]methyl}oxetane (ARONE OXETANE OXT-221 manufactured by Toagosei Company, Limited), 1.09 g of 2-methylimidazole, and 9.05 g of an epoxy group-terminated coupling agent (KBM403 manufactured by Shin-Etsu Chemical Co., Ltd.) were added to the resultant solution. Thus, a casting solution for a second resin layer was obtained.

10 g of the resin compound A obtained in Synthesis Example 1 were dissolved in 90 g of cyclopentanone. Further, a leveling agent (BYK307 manufactured by BYK-Chemie GmbH) was added to the solution so that its concentration was 750 ppm. Thus, a casting solution for a first resin layer was obtained.

One surface of an inorganic glass (thickness: 50 µm, measuring 10 cm long by 4 cm wide) was washed with methyl ethyl ketone. After that, the surface was subjected to a corona treatment and then to a coupling treatment with an epoxy terminal coupling agent (KBM403 manufactured by Shin-Etsu Chemical Co., Ltd.). Next, the casting solution for a second resin layer was applied to the surface of the inorganic glass subjected to the coupling treatment. The solution was dried at 100° C. for 10 minutes and then subjected to a heat treatment at 170° C. for 20 minutes. Thus, a second resin layer having a thickness of 1 µm was formed. The other surface was similarly treated so that the second resin layer was formed.

The casting solution for a first resin layer was applied onto the second resin layer and then dried at 90° C. for 15 minutes. Further, the casting solution for a first resin layer was also applied onto the second resin layer on the other surface and then dried at 85° C. for 10 minutes. After that, both surfaces were dried at 130° C. for 10 minutes and then subjected to a heat treatment at 170° C. for 20 minutes. Thus, a first resin layer having a thickness of 30 µm was formed on each side.

Thus, a transparent substrate having a total thickness of 112 µm was obtained.

It should be noted that the respective layers formed on both surfaces of the inorganic glass were each formed so as to be of a size measuring 10 cm long by 3 cm wide, and a portion of the inorganic glass measuring 10 cm long by 1 cm wide was exposed.

Example 2

A transparent substrate was obtained in the same manner as in Example 1 except that the resin compound B obtained in Synthesis Example 2 was used instead of the resin compound A obtained in Synthesis Example 1.

Example 3

A transparent substrate was obtained in the same manner as in Example 1 except that the resin compound C obtained in Synthesis Example 3 was used instead of the resin compound A obtained in Synthesis Example 1.

Example 4

A transparent substrate was obtained in the same manner as in Example 1 except that the resin compound D obtained in Synthesis Example 4 was used instead of the resin compound A obtained in Synthesis Example 1.

Example 5

A 10-wt % cyclopentanone solution of the resin compound A obtained in Synthesis Example 1 was applied onto a polyethylene terephthalate and then dried. Thus, a resin film having a thickness of 30 µm was obtained.

The resultant resin film was attached to one surface of an inorganic glass (thickness: 50 µm, measuring 10 cm long by 4 cm wide) subjected to a coupling treatment with an epoxy terminal coupling agent (KBM403 manufactured by Shin-Etsu Chemical Co., Ltd.) through an adhesive layer containing 80 g of 3,4-epoxycyclohexenylmethyl-3',4'-epoxycyclohexene carboxylate (CELLOXIDE 2021P manufactured by Daicel Chemical Industries, Ltd.), 20 g of 3-ethyl-3{[(3-ethyloxetane-3-yl)methoxy]methyl}oxetane (OXETANE 221 manufactured by Toagosei Company, Limited), 3 g of an epoxy group-terminated coupling agent (KBM403 manufactured by Shin-Etsu Chemical Co., Ltd.), 5 g of a photopolymerization initiator (Ir-250 manufactured by Ciba Specialty Chemicals Inc.), and 0.5 g of a photosensitizer thioxantone. After that, the resultant was irradiated with UV light at 1,000 mJ/cm$^2$. Next, the resultant was subjected to post curing at 150° C. The other surface was similarly treated. Thus, a transparent substrate having a total thickness of 110 µm and including resin layers on both surfaces of the inorganic glass was obtained.

It should be noted that the respective layers formed on the inorganic glass were each formed so as to be of a size measuring. 10 cm long by 3 cm wide, and a portion of the inorganic glass measuring 10 cm long by 1 cm wide was exposed.

Example 6

A transparent substrate was obtained in the same manner as in Example 1 except that the resin compound G obtained in Synthesis Example 7 was used instead of the resin compound A obtained in Synthesis Example 1.

Example 7

A transparent substrate was obtained in the same manner as in Example 1 except that the resin compound J obtained in Synthesis Example 10 was used instead of the resin compound A obtained in Synthesis Example 1.

Example 8

A transparent substrate was obtained in the same manner as in Example 1 except that the resin compound K obtained in Synthesis Example 11 was used instead of the resin compound A obtained in Synthesis Example 1.

Comparative Example 1

A transparent substrate was obtained in the same manner as in Example 1 except that a commercially available polyallylate (M-4000 manufactured by Unitika) was used instead of the resin compound A obtained in Synthesis Example 1.

Comparative Example 2

A transparent substrate was obtained in the same manner as in Example 1 except that a commercially available polyether sulfone (SUMIKAEXCEL 5003P manufactured by Sumitomo Chemical Co., Ltd.) was used instead of the resin compound A obtained in Synthesis Example 1.

Comparative Example 3

A transparent substrate was obtained in the same manner as in Example 1 except that the resin compound F obtained in Synthesis Example 6 was used instead of the resin compound A obtained in Synthesis Example 1.

Comparative Example 4

A transparent substrate was obtained in the same manner as in Example 1 except that the resin compound H obtained in Synthesis Example 8 was used instead of the resin compound A obtained in Synthesis Example 1.

Comparative Example 5

A transparent substrate was obtained in the same manner as in Example 5 except that a commercially available cycloolefin polymer film (ZF-16 manufactured by Zeon Corporation) was used instead of the resin film containing the resin compound A obtained in Synthesis Example 1.

Comparative Example 6

A transparent substrate was obtained in the same manner as in Example 1 except that the resin compound I obtained in Synthesis Example 9 was used instead of the resin compound A obtained in Synthesis Example 1.

Comparative Example 7

A transparent substrate was obtained in the same manner as in Example 1 except that the resin compound E obtained in Synthesis Example 5 was used instead of the resin compound A obtained in Synthesis Example 1.

Comparative Example 8

A transparent substrate was obtained in the same manner as in Example 1 except that a commercially available polyallylate (U-100 manufactured by Unitika) was used instead of the resin compound A obtained in Synthesis Example 1.

Comparative Example 9

In a reaction vessel provided with a stirring apparatus, 7.65 g (0.028 mol) of 4,4'-(1,3-dimethylbutylidene)bisphenol, 13.2 g (0.043 mol) of 4,4'-(3,3,5-trimethylcyclohexylidene) bisphenol, 0.463 g of benzyltriethylammonium chloride, and 0.023 g of p-tertiarybutyl phenol were dissolved in 204 g of a 1-M solution of sodium hydroxide. A solution prepared by dissolving 14.4 g (0.071 mol) of terephthaloyl chloride in 294 g of chloroform was added to the resultant solution all at once while the latter solution was stirred, and then the mixture was stirred at room temperature for 120 minutes. After that, a chloroform solution containing a resin compound was separated by settled separation, and then the chloroform solution was sequentially washed with acetic acid water and ion-exchanged water. After that, the chloroform solution was charged into methanol so that the resin compound was deposited. The deposited resin compound was filtrated and dried under reduced pressure. Thus, 32 g of a white resin compound were obtained.

No transparent substrate could be obtained because the resultant resin compound did not dissolve in toluene nor cyclopentanone.

Comparative Example 10

In a reaction vessel provided with a stirring apparatus, 7.9 g (0.029 mol) of 4,4'-(1,3-dimethylbutylidene)bisphenol, 8.5 g (0.029 mol) of 4,4'-(1-phenylethylidene)bisphenol, 3.2 g (0.015 mol) of bis(4-hydroxyphenyl) sulfide, and 0.435 g of benzyltriethylammonium chloride were dissolved in 230 g of a 1-M solution of sodium hydroxide. A solution prepared by dissolving 14.85 g (0.073 mol) of terephthaloyl chloride in 223 g of chloroform was added to the resultant solution all at once while the latter solution was stirred, and then the mixture was stirred at room temperature for 120 minutes. After that, a chloroform solution containing a resin compound was separated by settled separation, and then the chloroform solution was sequentially washed with acetic acid water and ion-exchanged water. After that, the chloroform solution was charged into methanol. However, the resin compound did not deposit.

Comparative Example 11

In a reaction vessel provided with a stirring apparatus, 8.95 g (0.029 mol) of 4,4'-(3,3,5-trimethylcyclohexylidene) bisphenol, 12.54 g (0.043 mol) of 4,4'-(1-phenylethylidene) bisphenol, and 0.477 g of benzyltributylammonium chloride were dissolved in 199 g of a 1-M solution of sodium hydroxide. A solution prepared by dissolving 14.6 g (0.072 mol) of terephthaloyl chloride in 219 g of toluene was added to the resultant solution all at once while the latter solution was stirred, and then the mixture was stirred at room temperature for 120 minutes. After that, a toluene solution containing a resin compound was separated by settled separation, and then the toluene solution was sequentially washed with acetic acid water and ion-exchanged water. After that, the toluene solution was charged into methanol. However, the resin compound did not deposit.

Comparative Example 12

In a reaction vessel provided with a stirring apparatus, 5.44 g (0.029 mol) of (1,1'-biphenyl)-4,4'-diol, 12.7 g (0.044 mol) of 4,4'-(1-phenylethylidene)bisphenol, and 0.403 g of benzyltributylammonium chloride were dissolved in 168 g of a 1-M solution of sodium hydroxide. A solution prepared by dissolving 14.8 g (0.073 mol) of terephthaloyl chloride in 280 g of toluene was added to the resultant solution all at once while the latter solution was stirred, and then stirring of the mixture was started at room temperature. However, the resin compound begun to deposit immediately after the start of the stirring, making it impossible to stir. Therefore it was unable to continue the polymerization.

Comparative Example 13

In a reaction vessel provided with a stirring apparatus, 7.35 g (0.029 mol) of 4,4'-(1-methylethylidene)bis(2-methylphenol), 12.54 g (0.043 mol) of 4,4'-(1-phenylethylidene)bisphenol, and 0.442 g of benzyltributylammonium chloride were dissolved in 184 g of a 1-M solution of sodium hydroxide. A solution prepared by dissolving 14.6 g (0.072 mol) of terephthaloyl chloride in 280 g of toluene was added to the resultant solution all at once while the latter solution was stirred, and then the mixture was stirred at room temperature for 120 minutes. After that, a toluene solution containing a resin compound was separated by settled separation, and then the toluene solution was sequentially washed with acetic acid water and ion-exchanged water. After that, the toluene solution was charged into methanol. However, the resin compound did not deposit.

Comparative Example 14

In a reaction vessel provided with a stirring apparatus, 6.17 g (0.029 mol) of 4,4'-ethylidenebisphenol, 12.54 g (0.043 mol) of 4,4'-(1-phenylethylidene)bisphenol, and 0.415 g of benzyltriethylammonium chloride were dissolved in 173 g of a 1-M solution of sodium hydroxide. A solution prepared by dissolving 14.6 g (0.072 mol) of terephthaloyl chloride in 280 g of toluene was added to the resultant solution all at once while the latter solution was stirred, and then the mixture was stirred at room temperature for 120 minutes. After that, a toluene solution containing a resin compound was separated by settled separation, and then the toluene solution was sequentially washed with acetic acid water and ion-exchanged water. After that, the c toluene solution was charged into methanol. However, the resin compound did not deposit.

<Evaluation>

The resin compounds obtained in Synthesis Examples 1 to 11, the polyallylates used in Comparative Examples 1 and 8, the polyether sulfone used in Comparative Example 2, and the cycloolefin polymer film used in Comparative Example 5 were evaluated by the following methods. Table 1 shows the results.

(1) Glass Transition Temperature (Tg)

Measurement was performed with a dynamic viscoelasticity spectrum-measuring device (ARES manufactured by Rheometric Scientific) at a frequency of 10 Hz in the range of 30° C. to 310° C. at a rate of temperature increase of 5° C./min. The peak top of tan θ was defined as a glass transition temperature.

(2) Weight-Average Molecular Weight (Mw)

Measurement was performed with a gel permeation chromatography apparatus (HLC-8120GPC manufactured by TOSHO CORPORATION) under the following conditions. Note that, the weight-average molecular weight was calculated in terms of polystyrene.
Data processing apparatus: GPC-8020 manufactured by TOSHO CORPORATION
Column: sample column; "G7000H$_{XL}$-H"+"GMH$_{XL}$-H"+ "GMH$_{XL}$" manufactured by TOSHO CORPORATION
Column size: each were 7.8 mmφ×30 cm (Total 90 cm)
Flow rate: 0.8 ml/min
Injected sample concentration: 0.1 wt %
Injected amount: 100 μl
Column temperature: 40° C.
Eluent: tetrahydrofuran
Detector: differential refractometer (RI)

(3) Modulus of Elasticity

A modulus of elasticity was measured by single indentation measurement for a hard coat layer (indenter: Berkovich (triangular pyramid shape), indentation depth: 230 nm to 280 nm) using a "Tribo Indenter" (product name) manufactured by Hysitron.

(4) Fracture Toughness Value

A slot-shaped resin sample measuring 50 μm thick by 2 cm wide by 15 cm long was produced, and a crack (5 mm) was produced at an end (central portion) in the lengthwise direction of the slot. A tensile stress was applied with an AUTO-GRAPH (AG-I manufactured by Shimadzu Corporation) in the lengthwise direction of the slot, and then a stress at the time of the rupture of the resin from the crack was measured. Test conditions were as described below. A chuck-to-chuck distance was set to 10 cm, and a tension speed was set to 10 mm/min. A fracture toughness value $K_{IC}$ at the time of the rupture was determined by substituting the resultant tensile stress σ at the time of the rupture, a crack length a, and a sample width b into the following equation ("Fracture Studies on Ceramics" published by UCHIDA ROKAKUHO PUBLISHING CO., LTD., written by Akira Okada, P. 68 to 70).

$$K_{IC} = \sigma(\Pi a)^{1/2} F(a/b)$$

$$F(a/b) = 1.12 - 0.231(a/b) + 10.55(a/b)^2 - 21.72(a/b)^3 + 30.39(a/b)^4 \quad [\text{Eq. 1}]$$

Each of the transparent substrates obtained in Examples 1 to 8 and Comparative Examples 1 to 8 was evaluated by the following methods. Table 1 shows the results.

(5) Rupture Diameter (a) The transparent substrates obtained were prepared as samples for evaluation.

(b) A crack measuring 5 mm or less was produced at the center of a longitudinal side end of the exposed portion of each inorganic glass.

(c) The longitudinal side of each sample for evaluation was bent, and the diameter of a circle using the longitudinal side as its circumference at the time when the crack progressed in the exposed portion of the inorganic glass and further progressed by 1 cm in a laminate region of a resin and the like was defined as a rupture diameter.

(6) Solvent Crack Resistance

Each of acetone, isopropyl alcohol (IPA), dimethyl sulfoxide (DMSO), and a polar mixed solvent was dropped to the outermost layer (first resin layer) of a transparent substrate, and then the substrate was left to stand under room temperature for 5 minutes. The state of the outermost layer (first resin layer) after the removal of the solvent was visually observed. It should be noted that the polar mixed solvent was obtained by adding 10 wt % of pure water to a resist-peeling liquid 104 for liquid crystal (manufactured by TOKYO OHKA KOGYO Co., Ltd.).

o . . . No crack occurred and the resin did not dissolve.
x . . . A crack occurred or the resin dissolved.

TABLE 1

| | Resin layer | Tg (° C.) | Mw (×10⁴) | Modulus of elasticity (GPa) | Fracture toughness value (MPa·m$^{1/2}$) | Rupture diameter (mm) | Solvent crack resistance | | | |
|---|---|---|---|---|---|---|---|---|---|---|
| | | | | | | | Acetone | IPA | DMSO | Polar mixed solvent |
| Example 1 | Synthesis Example 1 | 275 | 14 | 1.7 | 2.5 | 22 | o | o | o | o |
| Example 2 | Synthesis Example 2 | 290 | 16 | 1.7 | 2.5 | 22 | o | o | o | o |
| Example 3 | Synthesis Example 3 | 275 | 14 | 1.7 | 2.5 | 22 | o | o | o | o |
| Example 4 | Synthesis Example 4 | 293 | 15 | 1.7 | 2.5 | 22 | o | o | o | o |
| Example 5 | Synthesis Example 1 | 275 | 14 | 1.7 | 2.5 | 22 | o | o | o | o |
| Example 6 | Synthesis Example 7 | 260 | 17 | 1.7 | 2.5 | 22 | o | o | o | o |
| Example 7 | Synthesis Example 10 | 260 | 16 | 1.7 | 2.5 | 22 | o | o | o | o |
| Example 8 | Synthesis Example 11 | 250 | 20 | 1.6 | 2.7 | 22 | o | o | o | o |
| Comparative Example 1 | Polyallylate M-4000 | 240 | 7 | 1.8 | 3.2 | 22 | x | o | x | x |
| Comparative Example 2 | Polyether sulfone SUMIKAEXCEL 5003P | 225 | — | 2.3 | 4 | 22 | x | o | x | x |
| Comparative Example 3 | Synthesis Example 6 | 250 | — | 1.7 | 2.5 | 22 | x | o | x | x |
| Comparative Example 4 | Synthesis Example 8 | 200 | — | 1.9 | 2.6 | 22 | x | o | o | x |
| Comparative Example 5 | Cycloolefin polymer film ZF-16 | 163 | — | 2.2 | 4.6 | 25 | o | o | o | o |
| Comparative Example 6 | Synthesis Example 9 | 210 | — | 1.6 | 2.8 | 22 | x | o | o | x |
| Comparative Example 7 | Synthesis Example 5 | 245 | 7.2 | — | — | 22 | x | o | x | x |
| Comparative Example 8 | Polyallylate U-100 | 195 | — | 1.8 | 3.5 | 22 | x | o | x | x |
| Comparative Example 9 | The resin compound did not dissolve in the application solvent. | | | | | — | — | — | — | |
| Comparative Example 10 | No resin compound was obtained. | | | | | — | — | — | — | |
| Comparative Example 11 | No resin compound was obtained. | | | | | — | — | — | — | |

TABLE 1-continued

| Resin layer | Tg (°C.) | Mw (×10⁴) | Modulus of elasticity (GPa) | Fracture toughness value (MPa·m^(1/2)) | Rupture diameter (mm) | Solvent crack resistance | | | |
|---|---|---|---|---|---|---|---|---|---|
| | | | | | | Acetone | IPA | DMSO | Polar mixed solvent |
| Comparative Example 12 | The polymerization of the resin compound was impossible. | | | | — | — | — | — | |
| Comparative Example 13 | No resin compound was obtained. | | | | — | — | — | — | |
| Comparative Example 14 | No resin compound was obtained. | | | | — | — | — | — | |

As is apparent from Examples 1 to 8, the transparent substrate of the present invention is excellent in solvent crack resistance while having a modulus of elasticity and a fracture toughness value required for the substrate to be put into practical use. Such transparent substrate is excellent in handleability and has significantly excellent durability against a solvent to be used upon production of a display device, a solar cell, or a lighting device.

INDUSTRIAL APPLICABILITY

The transparent substrate of the present invention may be used in a display device, a solar cell, or a lighting device. Examples of the display device include a liquid crystal display, a plasma display, an organic EL display, and electronic paper. The lighting device is, for example, an organic EL device.

REFERENCE SIGNS LIST 10 inorganic glass
11, 11' first resin layer
12, 12' coupling agent layer
13, 13' second resin layer
100, 101, 102 transparent substrate

The invention claimed is:

1. A transparent substrate, comprising:
an inorganic glass; and
a first resin layer placed on at least one side of the inorganic glass,
wherein:
the first resin layer contains a resin compound having repeating units represented by general formulae (1), (2), and (3); and
no solvent crack occurs when a mixed solvent containing 20 wt % to 95 wt % of at least one kind of solvent selected from the group consisting of acetone, N-methylpyrrolidone, dimethyl sulfoxide, and N,N-dimethylformamide is brought into contact with the substrate:

[Chem. 1]

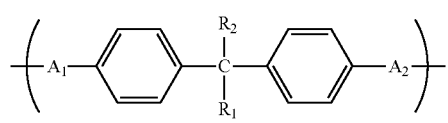
(1)

$-\!\!+\!\!A_3\!-\!X\!-\!A_4\!\!+\!\!-$ (2)

-continued

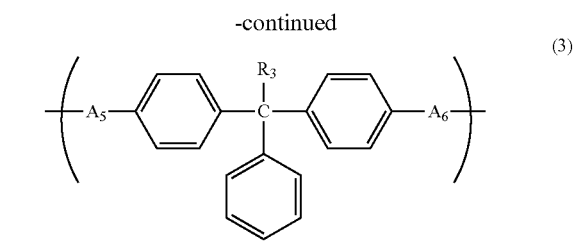
(3)

(4)

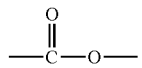
(5)

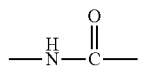
(6)

(7)

(8)

in the formula (1), $R_1$ represents a linear or branched alkyl group having 1 to 5 carbon atoms, $R_2$ represents a linear or branched alkyl group having 2 to 5 carbon atoms, and $A_1$ and $A_2$ each independently represent an oxygen atom, a single bond, or a linking group represented by a general formula (5);
in the formula (2), X represents a substituted or unsubstituted arylene group having 6 to 18 carbon atoms, and $A_3$ and $A_4$ each independently represent at least one kind selected from linking groups represented by general formulae (4) to (8), and the $A_3$ and the $A_4$ are bonded to para positions or meta positions of X;
in the formula (3), $R_3$ represents a methyl group, or a substituted or unsubstituted aryl group having 6 to 18 carbon atoms, and $A_5$ and $A_6$ each independently represent an oxygen atom, a single bond, or the linking group represented by the general formula (5); and
the number of $A_3$'s and $A_4$'s bonded to the para positions is three or more times as large as the number of $A_3$'s and $A_4$'s bonded to the meta positions.

2. A transparent substrate according to claim 1, wherein:
in the formula (1), $R_1$ represents a linear or branched alkyl group having 1 to 3 carbon atoms and $R_2$ represents a linear or branched alkyl group having 3 or 4 carbon atoms;
in the formula (2), X represents a substituted or unsubstituted arylene group having 6 to 12 carbon atoms, and $A_3$ and $A_4$ each independently represent the linking group represented by the general formula (4) or the general formula (5); and in the formula (3), $R_3$ represents a methyl group, or a substituted or unsubstituted aryl group having 6 to 12 carbon atoms.

3. A transparent substrate according to claim 1, wherein:

in the formula (1), $R_1$ represents a methyl group and $R_2$ represents an isobutyl group;

in the formula (2), X represents a substituted or unsubstituted arylene group having 6 to 12 carbon atoms, $A_3$ and $A_4$ each independently represent the linking group represented by the general formula (4) or the general formula (5), and the $A_3$ and the $A_4$ are bonded to the para positions of X; and in the formula (3), $R_3$ represents a methyl group, or a substituted or unsubstituted aryl group having 6 to 12 carbon atoms.

4. A transparent substrate according to any one of claims 1, 2, or 3, wherein the resin compound further has a repeating unit represented by a general formula (9):

[Chem. 2]

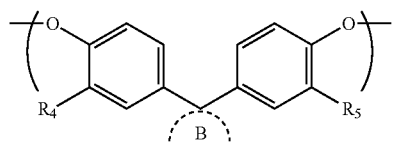

(9)

in the formula (9), $R_4$ and $R_5$ each independently represent a methyl group or hydrogen, and B represents a substituted or unsubstituted cycloalkane having 4 to 9 carbon atoms, or a substituted or unsubstituted fluorene.

5. A transparent substrate according to claim 4, further comprising a coupling agent layer provided directly for the inorganic glass.

6. A transparent substrate according to claim 4, further comprising a second resin layer between the inorganic glass and the first resin layer.

7. A transparent substrate according to claim 4, wherein the transparent substrate has a rupture diameter, which is determined when the transparent substrate is cracked and bent, of 50 mm or less.

8. A transparent substrate according to claim 4, wherein the resin compound is soluble in a solvent containing 50 wt % or more of toluene and/or xylene.

9. A display device, which is produced using the transparent substrate according to claim 8.

10. A solar cell, which is produced using the transparent substrate according to claim 8.

11. A lighting device, which is produced using the transparent substrate according to claim 8.

* * * * *